(12) United States Patent
Kim et al.

(10) Patent No.: US 8,988,115 B2
(45) Date of Patent: Mar. 24, 2015

(54) ELECTRONIC DEVICE AND METHOD FOR CONTROLLING TEMPERATURE THEREOF

(71) Applicant: Samsung Electronics Co., Ltd., Suwon-si, Gyeonggi-do (KR)

(72) Inventors: Jaechoon Kim, Incheon (KR); SangWook Ju, Hwaseong-si (KR); Eunseok Cho, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/830,651

(22) Filed: Mar. 14, 2013

(65) Prior Publication Data

US 2013/0321041 A1  Dec. 5, 2013

(30) Foreign Application Priority Data

Jun. 4, 2012 (KR) .......................... 10-2012-0059948

(51) Int. Cl.
*H01L 35/00* (2006.01)
*H03K 3/011* (2006.01)
*G06F 1/20* (2006.01)
*G06F 1/32* (2006.01)
*G06F 11/30* (2006.01)

(52) U.S. Cl.
CPC ................ *H03K 3/011* (2013.01); *G06F 1/206* (2013.01); *G06F 1/203* (2013.01); *G06F 1/324* (2013.01); *G06F 11/3058* (2013.01)
USPC .............. 327/82; 327/262; 327/512; 327/513

(58) Field of Classification Search
USPC .................................... 327/82, 262, 512, 513
See application file for complete search history.

(56) References Cited

U.S. PATENT DOCUMENTS

| | | | |
|---|---|---|---|
| 5,451,892 A | 9/1995 | Bailey | |
| 5,490,059 A * | 2/1996 | Mahalingaiah et al. | 700/46 |
| 5,930,110 A * | 7/1999 | Nishigaki et al. | 361/679.43 |
| 6,510,400 B1 * | 1/2003 | Moriyama | 702/132 |
| 6,647,320 B1 | 11/2003 | Inoue | |
| 6,777,900 B2 * | 8/2004 | Lee | 318/268 |
| 7,312,427 B2 | 12/2007 | Suenaga et al. | |
| 7,590,509 B2 * | 9/2009 | Riedlinger et al. | 702/182 |
| 8,013,431 B2 | 9/2011 | Lee | |
| 8,020,038 B2 * | 9/2011 | Riedlinger et al. | 714/10 |
| 2002/0108942 A1 * | 8/2002 | Yamanoi | 219/497 |
| 2004/0188069 A1 * | 9/2004 | Tomioka et al. | 165/104.33 |
| 2011/0234047 A1 | 9/2011 | Muraki et al. | |

(Continued)

FOREIGN PATENT DOCUMENTS

| | | |
|---|---|---|
| CN | 102541120 | 7/2012 |
| JP | 08-115142 | 5/1996 |

(Continued)

*Primary Examiner* — Ryan Jager
(74) *Attorney, Agent, or Firm* — F. Chau & Associates, LLC

(57) ABSTRACT

A method for controlling a temperature of an electronic device which includes a semiconductor chip is provided. The temperature control method includes measuring a temperature of a measurement point using the electronic device, comparing the temperature of the measurement point with a target temperature varying according to a period of time when the semiconductor chip operates using the electronic device, and decreasing a clock frequency of the semiconductor chip using the electronic device when the temperature of the measurement point is higher than the target temperature.

19 Claims, 12 Drawing Sheets

(56) References Cited

U.S. PATENT DOCUMENTS

| | | | |
|---|---|---|---|
| 2012/0049933 A1* | 3/2012 | Riechel et al. | 327/512 |
| 2012/0133427 A1 | 5/2012 | Kim et al. | |
| 2013/0073240 A1* | 3/2013 | Kameyama et al. | 702/65 |
| 2013/0166093 A1 | 6/2013 | Kim et al. | |

FOREIGN PATENT DOCUMENTS

| | | |
|---|---|---|
| JP | 2000-133908 | 5/2000 |
| JP | 2002-335060 | 11/2002 |
| JP | 2003-188568 | 7/2003 |
| JP | 2004-241405 | 8/2004 |
| JP | 2005-135350 | 5/2005 |
| JP | 2007-158228 | 6/2007 |
| JP | 2008-244288 | 10/2008 |
| JP | 2009-088031 | 4/2009 |
| JP | 2011-253971 | 12/2011 |
| KR | 100163704 | 9/1998 |
| KR | 1020010018576 | 3/2001 |
| KR | 1020040018051 | 3/2004 |
| KR | 1020050056410 | 6/2005 |
| KR | 1020130038440 | 4/2013 |
| KR | 1020130074293 | 7/2013 |

* cited by examiner

ELECTRONIC DEVICE AND METHOD FOR CONTROLLING TEMPERATURE THEREOF

CROSS-REFERENCE TO RELATED APPLICATIONS

This application claims priority to Korean Patent Application No. 10-2012-0059948 filed Jun. 4, 2012, the disclosure of which is hereby incorporated by reference herein in its entirety.

(i) TECHNICAL FIELD

The present disclosure relates to an electronic device and a temperature controlling method thereof

(ii) DISCUSSION OF THE RELATED ART

As electronic products have become more and more high-performance, an electronic device having a high-speed processor (e.g., an application processor) has been developed. If a processor operates at a high speed, generally, heat generation of the electronic device may increase. In the event that the heat generation of the electronic device increases over a specific level, the electronic device may operate abnormally, or the user of the electronic device may suffer burns. This difficulty may appear more seriously at smaller sized electronic products.

The above-described difficulty may be addressed by lowering an operating speed of the processor. However, in this case, the data processing capacity of the electronic device may decline. Thus, there is a need in the art for a technique capable of maximizing the data processing capacity of the electronic device and also controlling a temperature of the electronic device appropriately.

SUMMARY

Example embodiments of the inventive concept provide a method for controlling a temperature of an electronic device which includes a semiconductor chip. The method includes measuring a temperature of a measurement point using the electronic device, comparing the temperature of the measurement point with a target temperature varying according to a period of time when the semiconductor chip operates using the electronic device, and decreasing a clock frequency of the semiconductor chip using the electronic device when the temperature of the measurement point is higher than the target temperature.

In example embodiments, the period of time includes a first period of time and a second period of time which are continuous, and a first target temperature at the first period of time is higher than a second target temperature at the second period of time.

In example embodiments, the temperature control method further comprises increasing the clock frequency using the electronic device when the temperature of the measurement point is lower than the third target temperature due to a decrease in the clock frequency.

In example embodiments, a difference between the first target temperature and the second target temperature is over at least 0.5 times a difference between the second target temperature and the third target temperature.

In example embodiments, the first period of time includes an overshoot period of time at which the temperature of the measurement point is higher than the second target temperature.

In example embodiments, the first period of time includes a first point of time when the temperature of the measurement point is lower than the third target temperature, a second point of time when the temperature of the measurement point reaches the first target temperature, and a third point of time when the temperature of the measurement point is lower than the first target temperature and higher than the second target temperature.

In example embodiments, a difference between the temperature of the measurement point and the third target temperature at the first point of time is over at least about two times a difference between the second target temperature and the third target temperature.

In example embodiments, the temperature of the measurement point at the third point of time is the second target temperature.

In example embodiments, the second period of time includes a throttling period in which the temperature of the measurement point increases or decreases according to iteration of decrease and an increase of the clock frequency.

In example embodiments, the target temperature corresponds to a predetermined surface temperature of the electronic device.

In example embodiments, the target temperature is expressed by $(T_S+R_T \times T_R)$. Herein, $T_S$ is indicative of thermal resistance between the semiconductor chip and a surface of the electronic device and $T_R$ is indicative of heat emitted from the surface of the electronic device to the semiconductor chip.

In example embodiments, the measurement point is a point of the semiconductor chip.

In example embodiments, the semiconductor chip includes one of an application processor, a central processing unit, a logic chip, or a memory chip.

Example embodiments of the inventive concept provide an electronic device which include a package substrate, a semiconductor chip mounted on the package substrate, a temperature measuring device configured to measure a temperature of the semiconductor chip, and a temperature control circuit configured to decrease a clock frequency of the semiconductor chip when a temperature of the semiconductor chip is higher than a target temperature. The target temperature varies according to a period of time at which the semiconductor chip operates.

In example embodiments, the temperature measuring device is embedded in the package substrate and the temperature control circuit is built in the semiconductor chip.

Example embodiments of the inventive concept provide an electronic device which includes a printed circuit board, a semiconductor package mounted on the printed circuit board and electrically connected thereto. The semiconductor package includes a first package substrate disposed on the printed circuit board, a semiconductor chip in the form of an application processor disposed on a top surface of the first package substrate, in which the application processor includes at least one computer processing unit (CPU), a temperature measuring unit embedded in the application processor or the first package substrate configured to sense a temperature of a measurement point on the application processor, and a dynamic temperature module (DTM) configured to manage a temperature of a target part of the electronic device using a temperature management table including information indicative of a relationship between the sensed temperature of the measurement point of the application processor and a sensed temperature of a target part of the electronic device, a second package substrate disposed on top of the first package substrate and electrically connected thereto, and a plurality of memory chips attached to an upper surface of the second package substrate.

The electronic device further includes a temperature control circuit included in the application processor and configured to decrease a clock frequency of the application processor when a temperature of the application process is higher than a target temperature, wherein the target temperature varies according to a period of time at which the application processor operates, an upper case disposed on the semiconductor package, wherein the upper case includes a display panel configured to display an image, a touch screen configured to compute coordinate information of a point touched by an input device of the display panel, and a window member disposed on the touch screen and wherein the window member includes a display region at which images generated by the display panel are displayed and a non-display region adjacent to at least a part of the display region and a housing configured to receive the printed circuit board, the semiconductor package, the display panel and the touch screen therein.

BRIEF DESCRIPTION OF THE DRAWINGS

Exemplary embodiments of the inventive concept can be understood in more detail from the following description with reference to the following drawings, in which.

DETAILED DESCRIPTION OF EXEMPLARY EMBODIMENTS

Figure 1:
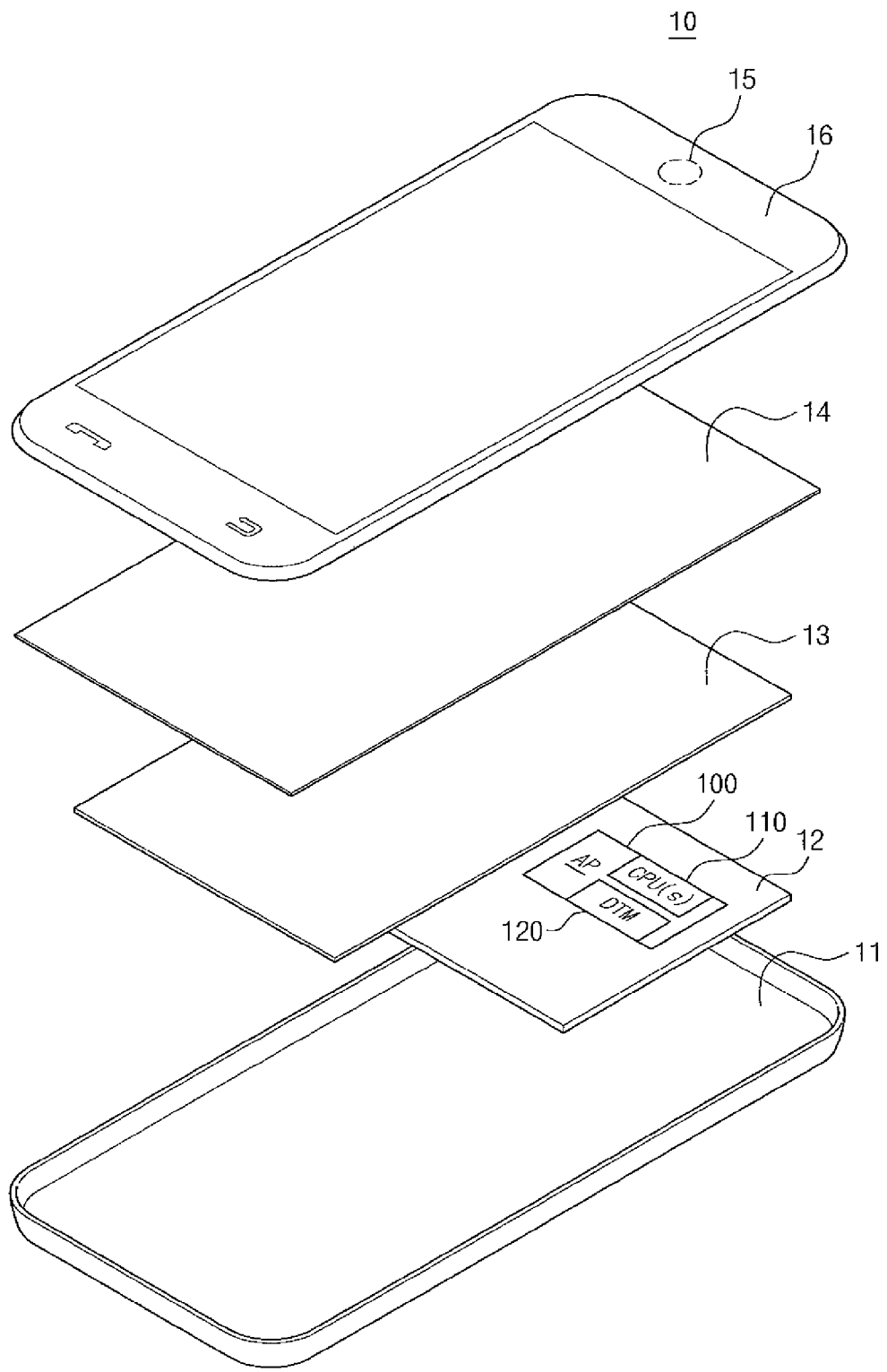
FIG. 1 is an exploded perspective view of an electronic device according to an embodiment of the inventive concept.

Embodiments will be described in detail with reference to the accompanying drawings. Example embodiments of the inventive concept, however, may be embodied in various different forms, and should not be construed as being limited only to example embodiments illustrated herein. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises", and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present.

FIG. 1 is an exploded perspective view of an electronic device according to an embodiment of the inventive concept. Referring to FIG. 1, an electronic device 10 may include, for example, a housing 11, a printed circuit board 12, a display panel 13, a touch screen or panel 14, an image sensor 15, and a window member 16.

The electronic device 10 may be, for example, a handheld phone. However, exemplary embodiments of the inventive concept are not limited thereto. For example, the electronic device 10 may include a variety of electronic devices such as a television, a navigation system, a computer monitor, a game machine, a tablet PC, another mobile device, and so on.

The housing 11 may receive components of the electronic device 10 such as, for example, the printed circuit board 12, the display panel 13, and the touch screen or panel 14. In FIG. 1, there is illustrated an example in which the housing 11 is formed of a member. However, the housing 11 can be formed of, for example, at least two members. Below, there will be described an example in which the housing 11 is formed of a member. In example embodiments, the housing 11 may further include, for example, a power supply (not shown) such as a battery according to a type of the display panel 13.

For example, at least one active element (not shown) and/or at least one passive element (not shown) may be mounted on the printed circuit board 12 to drive the electronic device 10. The printed circuit board 12 may include, for example, a semiconductor chip or a semiconductor package including the semiconductor chip. Herein, the semiconductor chip may be, for example, an application processor (hereinafter, referred to as AP) 100 to process multimedia data (picture or image) using an application program, a central processing unit (CPU), a logic chip, or a memory chip. The application program can be stored at a memory device (not shown) of the printed circuit board 12 or the AP 100.

Below, exemplary embodiments of the inventive concept will be described under the assumption that the semiconductor chip is the AP 100.

The AP 100 may include, for example, at least one CPU 110 and a dynamic temperature management module (hereinafter, referred to as a DTM module) 120.

The DTM module 120 may manage a temperature or heat generation of a target part of the electronic device 10 in view of a temperature of a measurement point of the electronic device 10. Herein, the measurement point may be, for example, any point of an interior or surface of the AP 100. Also, the target unit part may be, for example, the housing 11, the display panel 13, the touch screen 14, the window member 16, or an internal specific part.

In example embodiments, the DTM module 120 may be implemented such that a surface temperature of the target part does not exceed a predetermined value.

In example embodiments, the DTM module 120 may be implemented by hardware, software, or firmware. Below, it is assumed that the DTM module 120 is implemented by firmware. In this case, it is possible to update the DTM module 120 anytime.

In example embodiments, the measurement point may be, for example, a point of the interior or surface of the AP 100. In this case, a temperature sensor may be included within the AP 100 or mounted on a semiconductor package including the AP 100. The DTM module 120 may include a temperature management table indicating relationship between a temperature of the measurement point and a surface temperature of the target part. The temperature management table may be set by a maker of the electronic device 10.

The relationship between a temperature of the measurement point and a surface temperature of the target part may be computed using a thermal transfer modeling. This will be more fully described with reference to FIG. 2.

The display panel 13 may display images. The display panel 13 may not be limited to a specific panel. For example, the display panel 13 may include a variety of display panels such as an organic light emitting display panel, a liquid crystal display panel, a plasma display panel, an electrophoretic display panel, an electrowetting display panel, and so on.

The touch panel 14 may compute coordinate information of a point touched by an input means of the display panel 13. The touch panel 14 may be, for example, a resistive touch panel or a capacitive touch panel.

The resistive touch panel may be, for example, an analog resistive touch panel having two resistive films spaced apart from each other or a digital resistive touch panel having first resistive patterns and second resistive patterns spaced apart from the first resistive patterns. The resistive touch panel may detect a voltage output when the two resistive films are touched by an external pressure or when the first and second resistive patterns are touched by an external pressure, and may compute coordinate information of the touched point based on the detection result.

The capacitive touch panel may include, for example, first sensing patterns and second sensing patterns isolated from the first sensing patterns and disposed to be intersected with the first sensing patterns. The capacitive touch panel may detect a variation in capacitance generated by the first and second sensing patterns when an input means contacts with the capacitive touch panel, and may compute coordinate information of the contact point based on the variation in capacitance.

The image sensor 15 may sense images. In example embodiments, the image sensor 15 may be, for example, a CMOS image sensor. In FIG. 1, there is illustrated an example in which the image sensor 15 is located within the window member 16. However, example embodiments of the inventive concept are not limited thereto.

The window member 16 may be, for example, disposed on the touch panel 14, and may be combined with the housing 11 to form an external surface of the electronic device 10. In this case, the touch panel 14 can be combined with the window member 16. The window member 16 may include, for example, a display region AR at which images generated from the display panel 13 are displayed and a non-display region NAR adjacent to at least a part of the display region AR.

Although not shown in FIG. 1, the electronic device 10 may, for example, further include a variety of components such as a wireless communication unit, a nonvolatile/volatile memory, a microphone, a speaker, an audio processing unit, and so on.

The electronic device 10 may manage a temperature of the target part or heat generation using a temperature of the measurement point and the temperature management table. This will be more fully described later.

Figure 2:
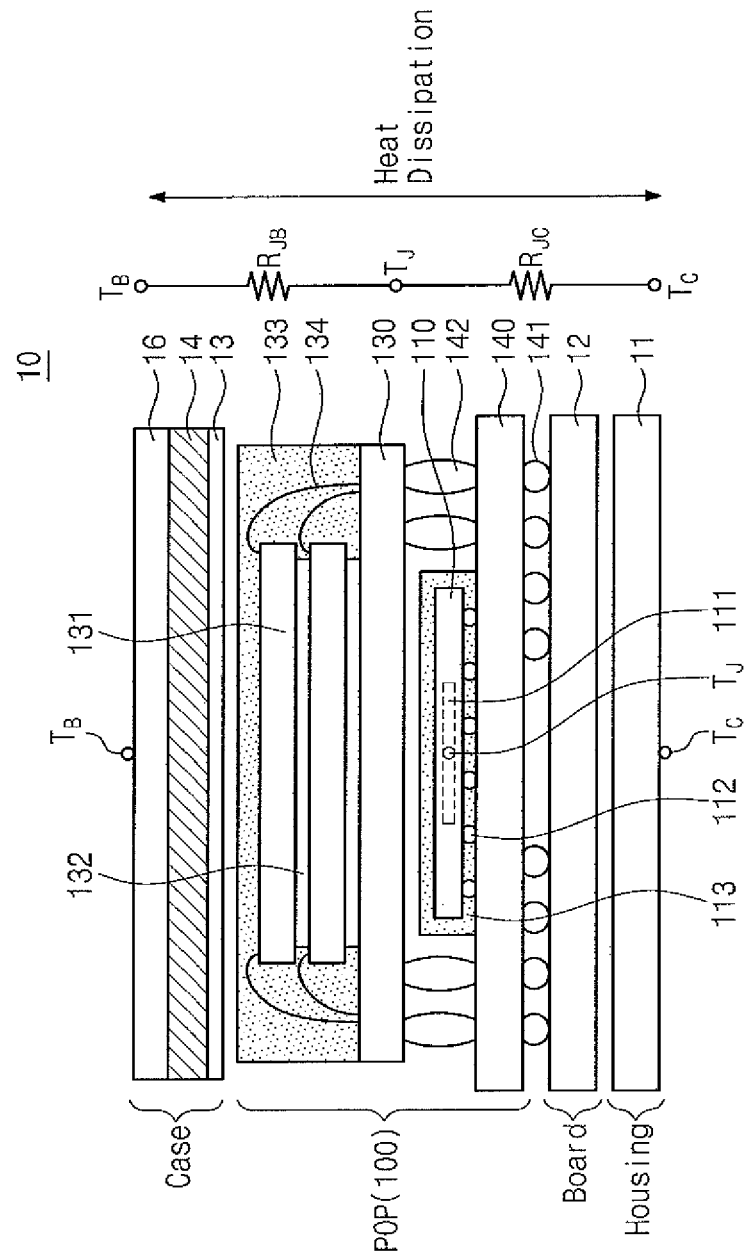
FIG. 2 is a cross-sectional view of an electronic device in FIG. 1.

FIG. 2 is a cross-sectional view of an electronic device in FIG. 1. Referring to FIG. 2, an electronic device 10 may include, for example, a housing 11, a printed circuit board 12, an upper case, and a semiconductor package 100.

In example embodiments, the semiconductor package 100 may include, for example, a package-on-package (POP) structure.

In example embodiments, the upper case may include, for example, a display panel 13, a touch screen 14, and a window member 16.

The semiconductor package 100 may include, for example, an AP 110, a substrate 140 (hereinafter, referred to as a first package substrate) on which the AP 110 is disposed, and a plurality of memory chips 131 mounted on a second package substrate 130. The semiconductor package 100 can further include, for example, a heat sinking plane for effective radiation of heat.

For example, the AP 110 may be mounted on a top surface of the first package substrate 140 at face-down (or, face-up) state, electrically connected with the first package substrate 140 through bumps 112, and molded by a first molding film 113. Memory chips 131 may be interconnected by, for example, adhesive films 132 and attached to a top surface of the second package substrate 130. Herein, the memory chips 131 may be, for example, isolated by the adhesive films 132. The memory chips 131 may be electrically connected with the second package substrate 130 through, for example, bonding wires 134, and may be molded by a second molding film 133. The first and second package substrates 140 and 130 may be electrically connected through, for example, solder balls 142. At a bottom surface of the first package substrate 140, there may be attached, for example, one or more external terminals 141 (hereinafter, referred to as first external terminals) which connects the semiconductor package 100 to the printed circuit board 12.

The PoP structure may be replaced with different types of packages such as, for example, a Package-In-Package (PIP), a System-In-Package (SIP), a Chip-On-Board (COB), a Board-On-Chip (BOC), a Multichip Package (MCP), and so on. Alternatively, a semiconductor chip such as, for example, a memory chip or a logic chip may be replaced. For example, the semiconductor package 100 may be replaced with a central processing unit (CPU).

The semiconductor package 100 may further include, for example, a temperature sensor 111 capable of sensing a temperature of the electronic device 100. The temperature sensor 111 may be, for example, embedded in the AP 110 or in the first package substrate 140. In the semiconductor package 100, a heating source may be the AP 110. Thus, a temperature of the AP 110 may represent a temperature of the semiconductor package 100. In example embodiments, a temperature of the AP 110 and a temperature of the semiconductor package 100 may be used in the same meaning.

In the event that a measurement point at which a temperature is sensed by the temperature sensor 111 is different from a target part being an object of temperature control, the relationship between a temperature of the measurement point and a temperature of the target part may be computed by, for example, a thermal transfer modeling. For example, it is assumed that the measurement point is any point of an interior or surface of the AP 110 and the target part is a case. In this case, the target part may be, for example, any point of a display panel 13, a touch screen 14, or a window member 16.

A heating source determining a temperature of the target part may be the AP 110, and a heat radiated from the AP 110 may be transferred to the target part through the semiconductor package 100. As a thermal transfer modeling is established between the AP 110 and the target part, a temperature of the target part may be determined by a temperature of the AP 110.

For example, the following equation 1 may show relationship between a temperature of the AP 110 and a temperature of the target part.

$$T_J = T_B + R_{JB} \times P_{JB} \quad (1)$$

Herein, $T_J$ may indicate a temperature of the measurement point (e.g., a point of an interior or surface of the AP 110), and $T_B$ may indicate a temperature of the target part (e.g., a point of a case). $R_{JB}$ may indicate thermal resistance (W) between the measurement point and the target part, and $P_{JB}$ may indicate heat (° C./W) emitted from the measurement point to the target part.

For example, when the target part is a housing, the following equation 2 may show relationship between a temperature of the AP 110 and a temperature of the target part.

$$T_J = T_C + R_{JC} \times P_{JC} \quad (2)$$

Herein, $T_J$ may indicate a temperature of the measurement point (e.g., a point of an interior or surface of the AP 110), and $T_C$ may indicate a temperature of the target part (e.g., a point of the housing). $R_{JC}$ may indicate thermal resistance (W) between the measurement point and the target part, and $P_{JC}$ may indicate heat (° C./W) emitted from the measurement point to the target part.

In the equations 1 and 2, the thermal resistance $R_{JB}$ and $R_{JC}$ may be experimentally obtained by, for example, performing a thermal transfer test on the electronic device 10. In the equations 1 and 2, the heat $R_{JB}$ and $R_{JC}$ may vary according to an operating frequency of the AP 110 and a program executed by the AP 110. Like the thermal resistance, however, each of the heat $R_{JB}$ and $R_{JC}$ may be experimentally obtained by performing, for example, a thermal transfer test on an operating frequency and an execution program.

A method of experimentally obtaining the thermal resistance $R_{JB}$ and $R_{JC}$ and the heat $P_{JB}$ and $P_{JC}$ may be well known, and a description thereof is thus omitted.

With the equations 1 and 2, it is possible to measure temperatures of a variety of positions (e.g., including a position at which the temperature sensor 111 is located) through the thermal transfer modeling method. This may mean that a reference temperature is capable of being established with respect to a variety of positions of the electronic device 100. For example, a temperature of the window member 16 may be obtained by measuring a temperature of the AP 110.

Figure 3:
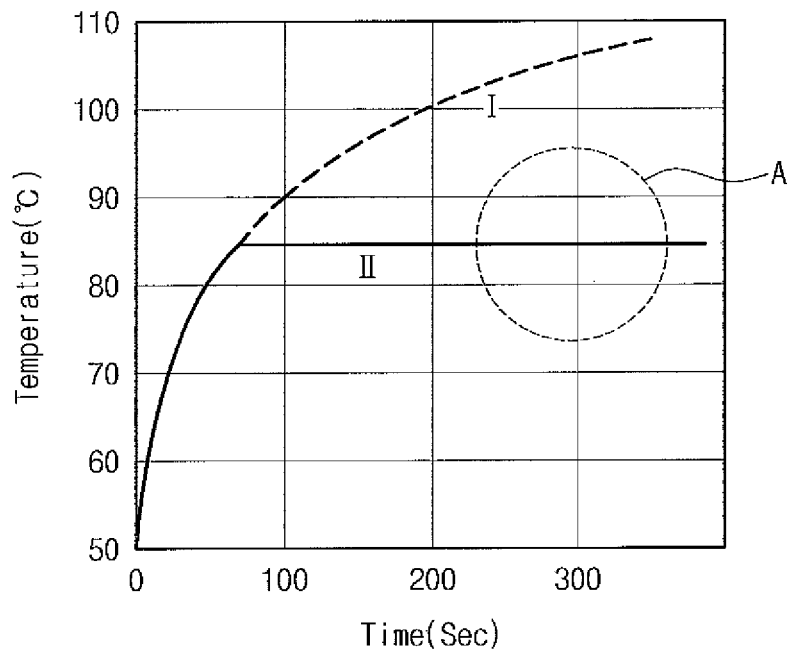
FIG. 3 is a diagram illustrating a temperature of a measurement point controlled according to an embodiment of the inventive concept.

FIG. 3 is a diagram illustrating a temperature of a measurement point controlled according to an embodiment of the inventive concept. In FIG. 3, a curve I may be a temperature curve of a measurement point when the inventive concept is not applied, and a curve II may be a temperature curve of a measurement point when the inventive concept is applied. Herein, the measurement point may be a point of an interior or surface of an AP 110 (refer to FIG. 2).

In the event that example embodiments of the inventive concept are not applied, the AP 110 may continue to operate according to the same clock frequency. A heating value of the AP 110 may be accumulated, not decrease. Thus, a temperature of the measuring point may continuously increase (a curve I).

With an embodiment of the inventive concept, however, if a temperature of the measuring point reaches a target temperature (hereinafter, referred to as a high target temperature), an electronic device 10 (refer to FIG. 2) may control a clock frequency to decrease. This may be performed to reduce a heating value of the AP 110. If the clock frequency of the AP 110 decreases, the heating value of the AP 110 may be, for example, reduced. In this case, a temperature of the measurement point may be limited below a constant level. If the clock frequency of the AP 110 decreases, a data processing speed of the AP 110 may be, for example, lowered.

Thus, if a temperature of the measurement point becomes lower than another target temperature (hereinafter, referred to as a low target temperature) according to a decrease in the clock frequency of the AP 110, the electronic device 10 may control the clock frequency of the AP 110 to increase. As a result, the electronic device 10 may maintain the data processing speed of the AP 110 appropriately.

With the above description, a temperature of the measurement point may be controlled to be maintained between the high target temperature and the low target temperature (a curve II).

Figure 4:
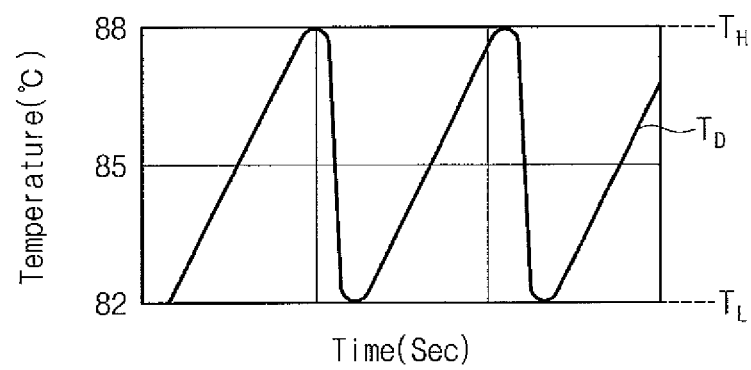
FIG. 4 is an enlarged diagram illustrating a region A in FIG. 3.

FIG. 4 is an enlarged diagram illustrating a region A in FIG. 3. Referring to FIG. 4, a region A may indicate a period in which a temperature of a measurement point is maintained between a high target temperature and a low target temperature. Hereinafter, the period may be referred to as a throttling period.

If a temperature of the measurement point reaches a high target temperature $T_H$, an electronic device 10 (refer to FIG. 2) may, for example, lower a clock frequency of an AP 110 (refer to FIG. 2). A heating value of the AP 110 may be reduced according to a decrease in the clock frequency, so that a temperature of the measuring point decreases. If a temperature of the measuring point reaches a low target temperature $T_L$, the electronic device 10 may, for example, increase the clock frequency of the AP 110. In this case, a heating value of the AP 110 may increase, so that a temperature of the measuring point also increases. Likewise, if a temperature of the measuring point again reaches the high target temperature $T_H$, the electronic device 10 may, for example, again lower the clock frequency of the AP 110. Thus, during the throttling period, a temperature curve of the measurement point may vibrate between the high target temperature $T_H$ and the low target temperature $T_L$.

With the above description, a temperature of the measuring point may be stably maintained by, for example, changing the clock frequency of the AP 110 through comparison of a temperature of the measuring point and a target temperature (e.g., the high target temperature and the low target temperature).

Figure 5:
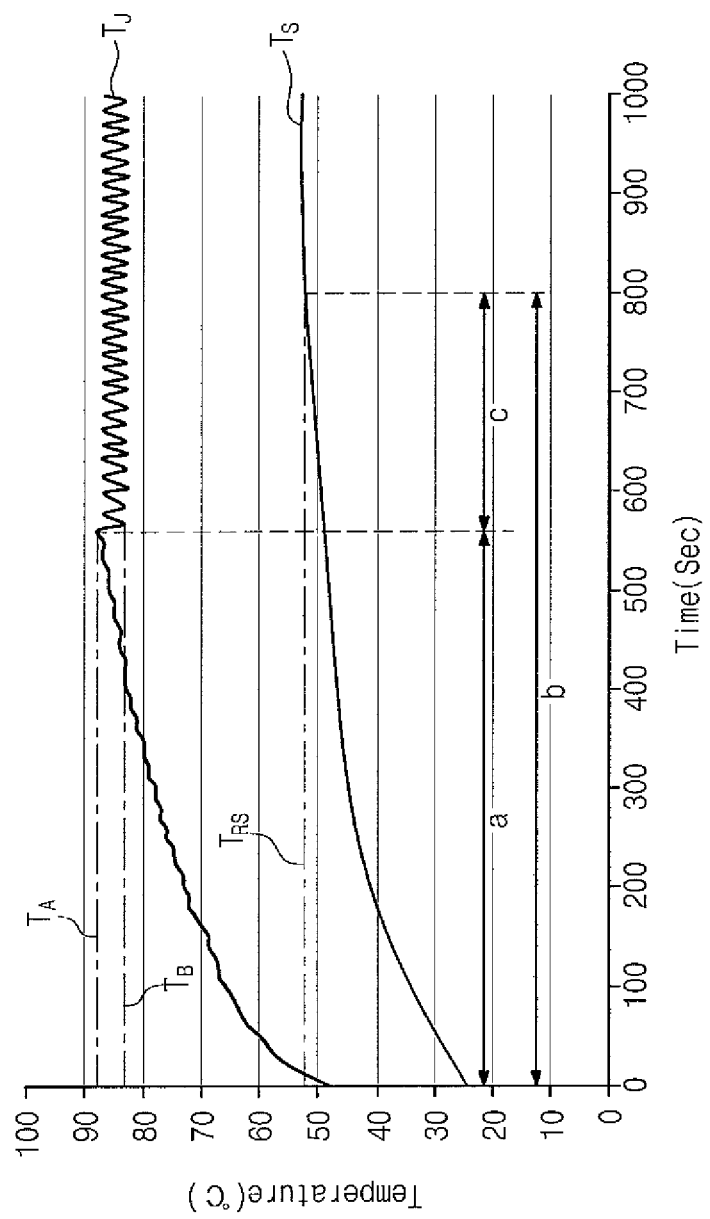
FIG. 5 is a diagram illustrating a temperature control method according to an embodiment of the inventive concept.

FIG. 5 is a diagram illustrating a temperature control method according to an embodiment of the inventive concept. In FIG. 5, there are illustrated a temperature curve $T_J$ of a measurement point and a temperature curve $T_S$ of a target part. It is assumed that the measurement point is a point of a surface of an AP 110 (refer to FIG. 2) and the target part is a point of a case (refer to FIG. 2).

Referring to FIG. 5, as the AP 110 operates using any clock frequency, a temperature of the AP 110 may increase, so that a heat generated by the AP 110 is transferred to a case. If a heating value transferred to the case is larger than a value emitted to the exterior through a window member, heat may, for example, be accumulated at the case. In this case, a temperature of the case may increase.

If a temperature of the case reaches a reference temperature $T_{RS}$, the electronic device 10 may, for example, lower the clock frequency of the AP 110 to reduce a temperature of the case. If a temperature of the case reaches another reference temperature according to a decrease in the clock frequency, the electronic device 10 may, for example, increase the clock frequency of the AP 110 to increase the data processing speed of the AP 110.

In example embodiments, the measurement point at which a temperature is measured by the temperature sensor may be located, for example, on the AP 110. A temperature of the case may not be measured directly. In this case, a temperature of the case may be estimated using a temperature of the measurement point through, for example, a thermal transfer modeling described in the equations 1 and 2. For example, when a temperature of the case is a reference temperature $T_{RS}$, a temperature of the AP 110 may be a predetermined temperature $T_A$. A temperature of the case may decrease according to a decrease in the clock frequency. If a temperature of the case reaches another reference temperature, a temperature of the AP 110 may be, for example, a predetermined temperature $T_B$. The temperature $T_B$ may be a low target temperature.

The high target temperature $T_A$ and the low target temperature $T_B$ may correspond to, for example, a reference temperature of the case. Accordingly, a temperature of the case need not be measured directly to maintain a temperature of the case within a constant range. A temperature of the measurement point of the AP 110 may be measured, and then it may be determined whether the measured temperature is higher than high target temperature $T_A$ or lower than the low target temperature $T_B$. The clock frequency of the AP 110 may be increased or decreased depending upon the determination result of whether the measured temperature is higher than high target temperature $T_A$ or lower than the low target temperature $T_B$.

In a typical thermal transfer modeling, a variation in a temperature of the case may be, for example, less than that of the AP 110. Thus, compared with a difference between the high target temperature $T_A$ and the low target temperature $T_B$, a variation width of a temperature curve of the case may be slight. Thus, as an example, an allowable temperature of the case may be set to a reference temperature $T_{RS}$, and target temperatures at which a temperature of the case is maintained within an error range may be set to the high target temperature $T_A$ or the low target temperature $T_B$.

In FIG. 5, there are illustrated periods of time a, b, and c. At the period of time a, a temperature curve $T_J$ of the AP 100 (hereinafter, referred to as an AP temperature curve) may continuously increase. If the period of time an elapses, the AP temperature curve may, for example, be controlled to be maintained between the high target temperature $T_A$ and the low target temperature $T_B$ (throttling period).

A temperature curve $T_S$ (hereinafter, referred to as a case temperature curve) of the case may increase or decrease according to, for example, an increase or decrease in the AP temperature curve $T_J$. Only, the case temperature curve $T_S$ may follow the AP temperature curve $T_J$ at a constant time difference due to a time delay of a thermal transfer process. Thus, the case temperature curve $T_S$ may continuously increase at the period of time b. If the period of time b elapses, the case temperature curve $T_S$ may be, for example, maintained within an error range of the reference temperature $T_{RS}$.

At the period of time c, a temperature of the case may be reach the reference temperature $T_{RS}$ while the AP temperature curve enters the throttling period. At the period of time c, the clock frequency of the AP 110 may be controlled by, for example, the target temperatures $T_A$ and $T_B$. Thus, although a margin exists at a temperature of the case, a data processing speed of the AP 110 may not be optimized because the clock frequency of the AP 110 is controlled by the target temperatures $T_A$ and $T_B$.

Figure 6:
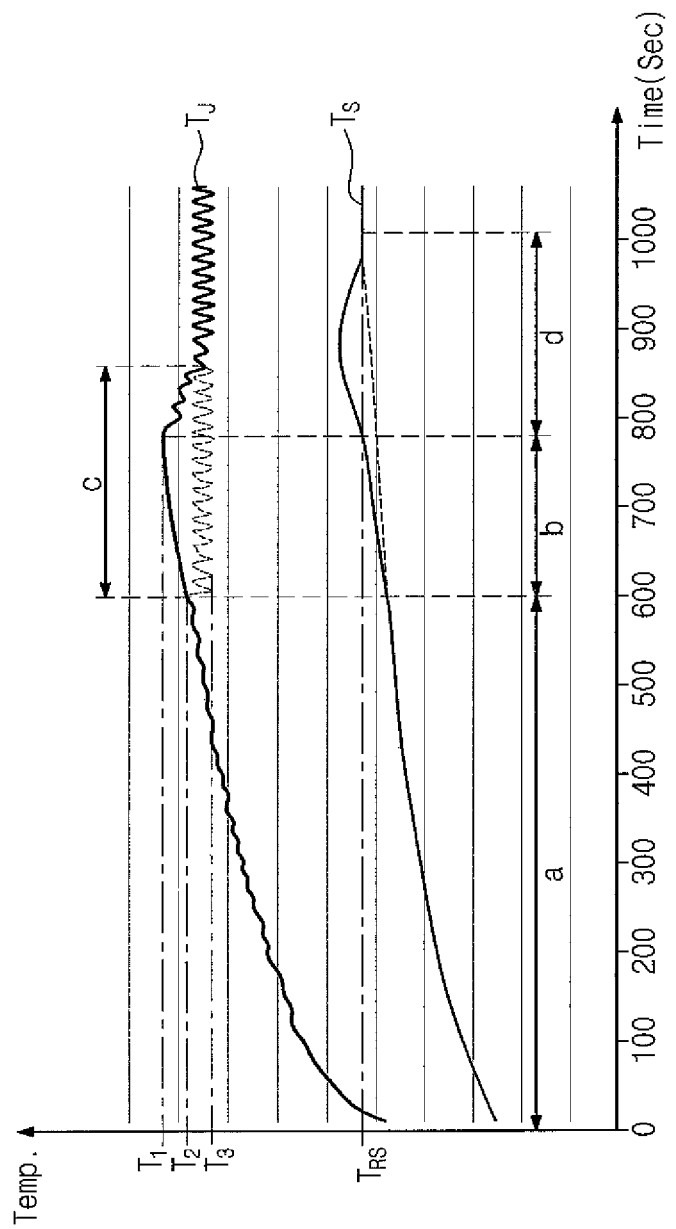
FIG. 6 is a diagram illustrating a temperature control method according to an embodiment of the inventive concept.

FIG. 6 is a diagram illustrating a temperature control method according to an embodiment of the inventive concept. In FIG. 6, there are illustrated temperature curves $T_J$ and $T_S$. A clock frequency of an AP 110 (refer to FIG. 2) may be controlled in view of a time delay between the temperature curves $T_J$ and $T_S$ not so as to be lowered at a period in which a case (refer to FIG. 2) has a temperature margin.

In example embodiments, the clock frequency of the AP 110 may not be lowered until, for example, a case temperature curve $T_S$ reaches a reference temperature $T_{RS}$. A temperature of the AP 110 (or, a measurement point) may, for example, be overshot up to a temperature T1 (hereinafter, referred to as a first target temperature) higher than a maximum temperature T2 (or, a high target temperature). Herein, an allowable temperature of the throttling period may mean, for example, a temperature of a measurement point at which a temperature of the case is continuously maintained within an error range of the reference temperature $T_{RS}$.

If a temperature of the AP 110 reaches the first target temperature, an electronic device 10 (refer to FIG. 2) may, for example, lower a clock frequency of the AP 110 to lower a temperature of the case. As the clock frequency of the AP 110 decreases, a temperature of the AP 110 may fall.

Like FIG. 5, the clock frequency of the AP 110 may be controlled by, for example, a high target temperature T2 and a low target temperature T3 to continuously maintain a temperature of the case within an error range of the reference temperature $T_{RS}$.

For example, even when the clock frequency of the AP 110 is lowered, a temperature of the AP 110 may be higher than a target temperature T2 (hereinafter, referred to as a second target temperature) at a period of time c. Thus, the clock frequency of the AP 110 may be controlled still in a decreasing state, and a temperature of the AP 110 may be continuously lowered.

If a temperature of the AP 110 continuously decreases after the period of time c, it may reach, for example, a low target temperature T3 (hereinafter, referred to as a third target temperature). In the event that a temperature of the AP 110 reaches the third target temperature T3, the electronic device 10 may, for example, make the clock frequency of the AP 110 be high for increasing the data processing ability of the AP 110. As the clock frequency of the AP 110 is higher, a temperature of the AP 110 may also increase. In this case, if a temperature of the AP 110 reaches the second target temperature, the electronic device 10 may, for example, lower the clock frequency of the AP 110 to reduce a temperature of the case. To maintain a temperature of the case within an error range of the reference temperature $T_{RS}$, the electronic device 10 may, for example, compare a temperature of the AP 110 (or, the measurement point) with the second and third target temperatures to iteratively increase or decrease the clock frequency of the AP 110.

With the above description, a clock frequency of the AP 110 may not be lowered during a period of time (a and b) (hereinafter, referred to as a first period of time) at which a temperature of the case reaches the reference temperature $T_{RS}$. A period of time at which the AP 110 operates at a high clock frequency may, for example, increase by the period of time b. This may mean that the data processing ability of the AP 110 is increased.

If a temperature of the case reaches the reference temperature $T_{RS}$, the clock frequency of the AP 110 may, for example, decrease, and a variation in a temperature of the AP 110 may be controlled by the second and third target temperatures. During a throttling period (e.g., a period of time after the period of time c) (hereinafter, referred to as a second period of time), the clock frequency of the AP 110 may, for example, increase or decrease to control a variation in a temperature of the AP 110.

The first period of time and the second period of time may be, for example, continuous, and a first target temperature T1 (refer to FIG. 6) of the first period of time may be higher than a second target temperature T2 of the second period of time.

Also, the first period of time may include, for example, a part or all of an overshoot period (c) at which a temperature of the measurement point is higher than the second target temperature T2.

In example embodiments, the first period of time may include, for example, a first point at which a temperature of the measurement point is lower than the third target temperature T3, a second point at which at which a temperature of the measurement point reaches the first target temperature T1, and a third point at which a temperature of the measurement point is lower than the first target temperature T1 and higher than the second target temperature T2.

In example embodiments, a difference between the first target temperature T1 and the second target temperature T2 may be set to be, for example, at least about 0.5 times a difference between the second target temperature T2 and the third target temperature T3.

In example embodiments, a difference between a temperature of the measurement point and the third target temperature at the first point may be, for example, at least about two or more times a difference between the second target temperature T2 and the third target temperature T3.

In example embodiments, a temperature of the measurement point at the third point of the first period of time may be, for example, the second target temperature T2. In this case, the first period of time may include, for example, an entire overshoot period (c).

In example embodiments, the second period of time may include, for example, a throttling period (a period after the period of time c) in which a temperature of the measurement point increases or decreases iteratively according to a decrease or increase in the clock frequency.

In example embodiments, the first to third target temperatures T1, T2 and T3 may correspond to, for example, specific temperatures of the case at a specific point of time. For example, the first target temperature may be set to a temperature of the AP 110 when a temperature of the case continuously increases to reach the reference temperature $T_{RS}$. Likewise, the second target temperature (or, a high target temperature) and the third target temperature (or, a low target temperature) may be set to, for example, temperatures of the AP 110 at which a temperature of the case is continuously maintained within an error range of the reference temperature $T_{RS}$. Relationship between a temperature of the AP 110 and a temperature of the case may be obtained in the same manner as described above.

With the above description, a temperature or a heating value of an electronic device may be controlled appropriately. Also, as a period of time at which a frequency of the AP 110 is not lowered is long at a temperature control process, the data processing ability of the electronic device may be increased.

Figure 7:
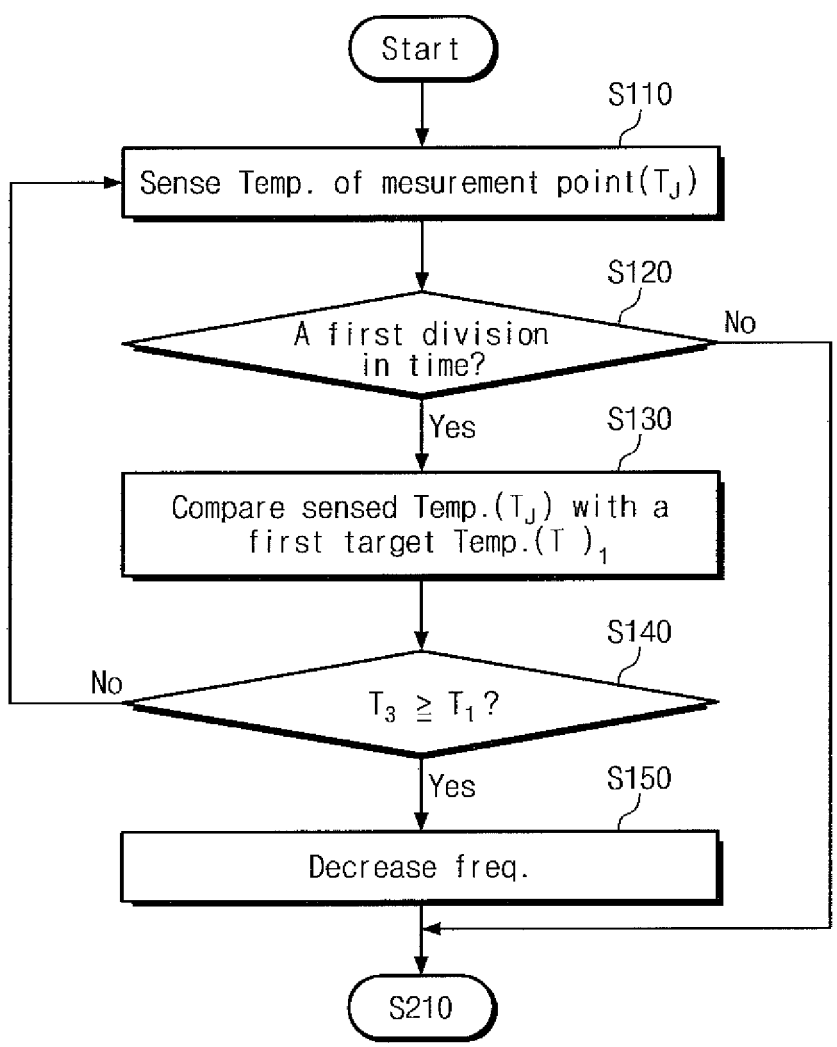
FIG. 7 is a flowchart illustrating a temperature control method at an overshoot period.
Figure 8:
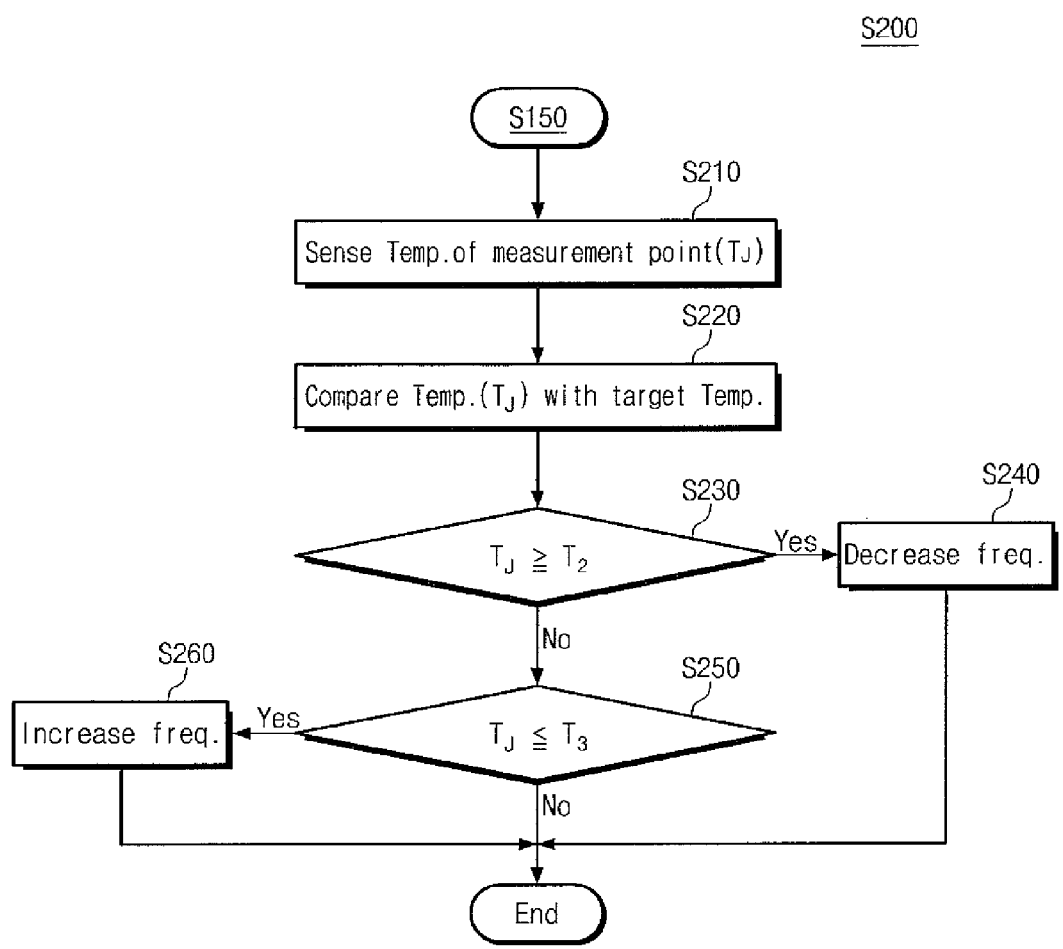
FIG. 8 is a flow chart illustrating a temperature control method at a second period of time.

FIGS. 7 and 8 are flow charts illustrating a temperature control method of an electronic device according to an embodiment of the inventive concept. In example embodiments, a clock frequency of an AP 110 may be controlled differently at a first period of time and a second period of time.

For example, FIG. 7 is a flowchart illustrating a temperature control method at an overshoot period.

In operation S110, an electronic device 10 (refer to FIG. 2) may sense a temperature $T_J$ (refer to FIG. 2) at a measurement point. In example embodiments, the measurement point may be a point of an interior or surface of an AP 110 (refer to FIG. 2). In example embodiments, a temperature sensor 111 (refer to FIG. 2) to sense a temperature of the measurement point may be included in the AP 110 or mounted on a substrate 130 (refer to FIG. 2).

In operation S120, the electronic device 10 may determine whether an operating time of a semiconductor chip belongs to a first period of time. If so, the method proceeds to operation S130. If not, the method proceeds to operation S210.

In operation S130, the electronic device 10 may compare the sensed temperature $T_J$ with a first target temperature T1 (refer to FIG. 1). Herein, the first target temperature T1 may mean a temperature of the measurement point when a temperature of a target part becomes a reference temperature $T_{RS}$. A detailed description on the first target temperature T1 may be the same as that described above.

In operation S140, the electronic device 10 may determine whether a temperature $T_J$ of the measurement point is equal to or higher than the first target temperature T1. If the temperature $T_J$ of the measurement point is equal to or higher than the first target temperature T1, the method proceeds to operation S150. If a temperature $T_J$ of the measurement point is lower than the first target temperature T1, the method proceeds to operation S110.

In operation S150, the electronic device 10 may lower a clock frequency of the AP 110 to reduce a temperature of the target part.

If operation S150 is ended, that is, if a control operation on a first period of time is ended, the method proceeds to operation S210 to perform a control operation on a second period of time.

For example, FIG. 8 is a flow chart illustrating a temperature control method at a second period of time.

If operation S150 (refer to FIG. 7) is ended, a temperature control method of an electronic device 10 (refer to FIG. 2) proceeds to operation S210.

In operation S210, the electronic device 10 may measure a temperature $T_J$ (refer to FIG. 2) of a measurement point. A detailed description on a measurement point and a temperature sensor 111 (refer to FIG. 2) to sense a temperature may be the same as that described with reference to FIG. 7.

In operation S220, the electronic device 10 may compare the sensed temperature TJ of the measurement point with a target temperature. Herein, the target temperature may be a second target temperature T2 (refer to FIG. 6) or a third target temperature T3 (refer to FIG. 6). A detailed description on the second and third target temperatures T2 and T3 may be the same as that described above.

In operation S230, the electronic device 10 may determine whether a temperature $T_J$ of a measurement point is equal to or higher than the second target temperature T2. If the temperature $T_J$ is equal to or higher than the second target temperature T2, the method proceeds to operation S240. If not, the method proceeds to operation S250.

In operation S240, the electronic device 10 may decrease a clock frequency of an AP 110 (refer to FIG. 2) to lower a temperature of a target part. If the clock frequency of the AP 110 decreases, a heating value of the AP 110 may be reduced, and a temperature of the target part may be lowered.

In operation S250, the electronic device 10 may determine whether a temperature $T_J$ of the measurement point is equal to or higher than the third target temperature T3. If the temperature $T_J$ is equal to or higher than the third target temperature T3, the method proceeds to operation S260. If not, the method may be ended.

In operation S260, the electronic device 10 may increase the clock frequency of the AP 110 to increase the data processing ability of the AP 110. If the clock frequency of the AP 110 increases, a heating value of the AP 110 may increase, and a temperature of the target part may rise.

With the above description, a temperature or a heating value of an electronic device may be controlled appropriately. Also, as a period of time at which a frequency of the AP 110 is not lowered is long at a temperature control process, the data processing ability of the electronic device may be increased.

Figure 9:
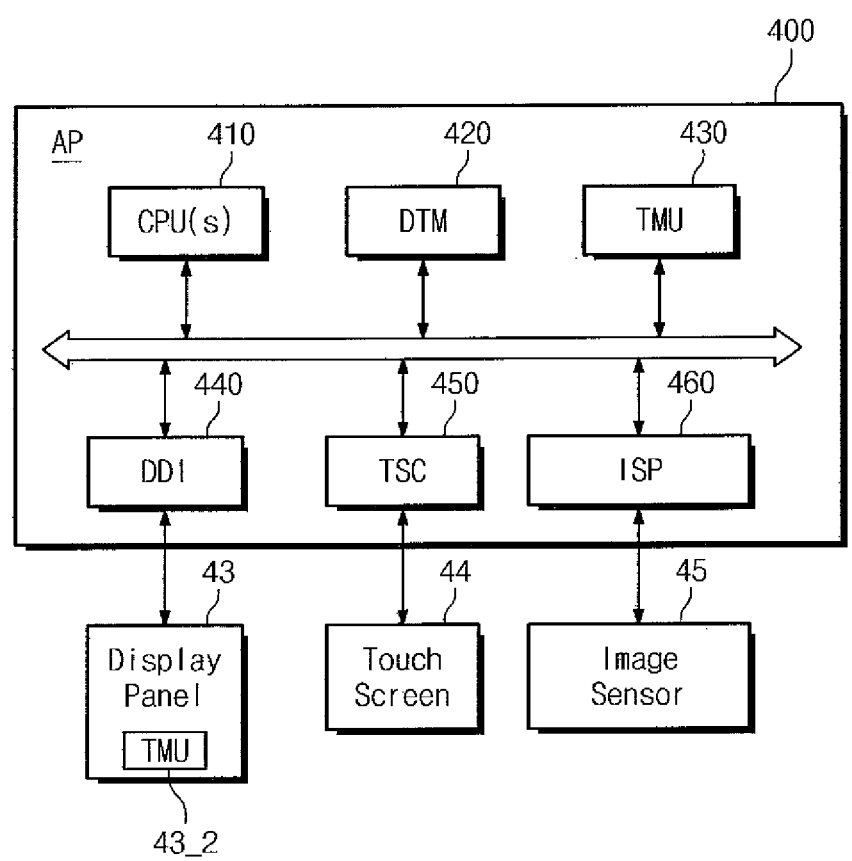
FIG. 9 is a block diagram of an electronic device describing a temperature control method according to an embodiment of the inventive concept.

For example, FIG. 9 is a block diagram of an electronic device describing a temperature control method according to an embodiment of the inventive concept. Referring to FIG. 9, an AP 400 may include, for example, a temperature measuring unit 430, and a display panel 43 may include a temperature measuring unit 43_2.

A DTM module 420 of an electronic device 10 according to an embodiment of the inventive concept may manage a temperature of a target part using a temperature management table corresponding to an AP temperature sensed in real time and a temperature of the display panel 43.

At this time, the target part may be, for example, a point of the display panel 43.

Herein, the temperature management table may include, for example, information indicative of a relationship between a temperature of a measurement point and a temperature of a target part. The relationship between a temperature of the measurement point and a temperature of the target part may be obtained in the same manner as described above.

The electronic device 10 according to an embodiment of the inventive concept may include, for example, temperature measuring units provided at the AP 400 and the display panel 43.

Figure 10:
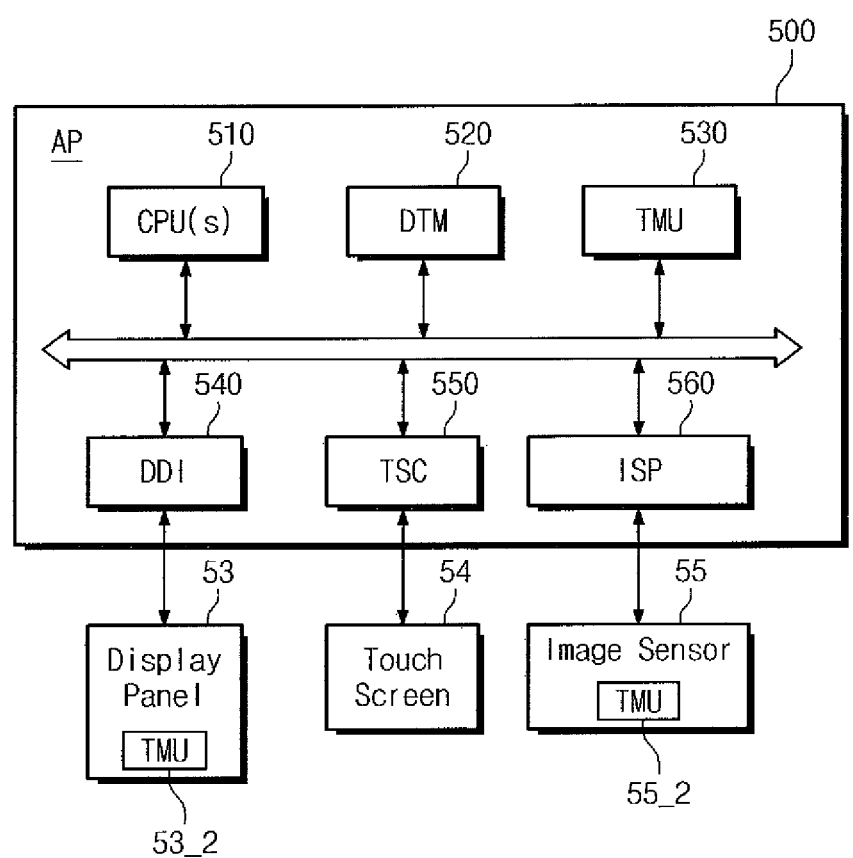
FIG. 10 is a block diagram of an electronic device describing a temperature control method according to an embodiment of the inventive concept.

For example, FIG. 10 is a block diagram of an electronic device describing a temperature control method according to an embodiment of the inventive concept.

For example, referring to FIG. 10, an AP 500 may include a temperature measuring unit 530, a display panel 53 may include a temperature measuring unit 53_2, and an image sensor 55 may include a temperature measuring unit 55_2.

A DTM module 520 of an electronic device 10 according to an embodiment of the inventive concept may manage, for example, a temperature of a target part using a temperature management table corresponding to an AP temperature sensed in real time, a temperature of the display panel 53, and a temperature of an image sensor 55.

Herein, the target part may be, for example, a point of the display panel 53 or the image sensor 55.

In the event that the target part includes a temperature sensor, a temperature control method according to an embodiment of the inventive concept may measure a temperature of the target part directly. In this case, the electronic device 10 may determine whether a temperature of the target part reaches a reference temperature $T_{RS}$. If a temperature of the target part is higher than the reference temperature $T_{RS}$, an operating frequency of the AP 400/500 may be, for example, decreased. Also, the electronic device 10 may determine, for example, whether a temperature of the target part reaches a reference temperature $T_{RS}$. If a temperature of the target part is lower than the reference temperature $T_{RS}$, an operating frequency of the AP 400/500 may be, for example, increased.

Figure 11:
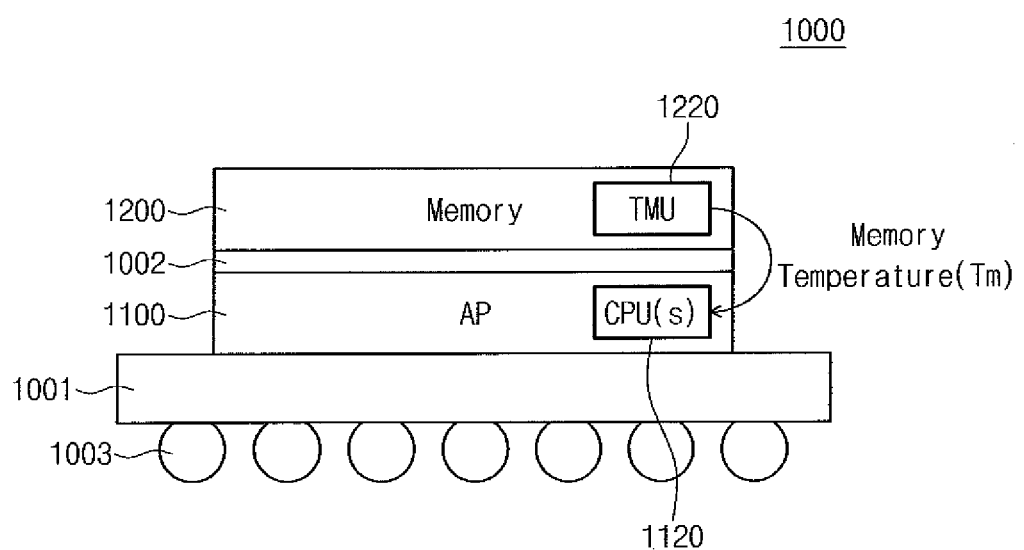
FIG. 11 is a diagram illustrating an embodiment in which a temperature control method of an electronic device according to an embodiment the inventive concept is applied to a memory of a multi-chip package.

FIG. 11 is a diagram illustrating an embodiment in which a temperature control method of an electronic device according to an embodiment of the inventive concept is applied to a memory of a multi-chip package. Referring to FIG. 11, a multi-chip package 1000 may have a structure in which, for example, an AP 1100 and a memory 1200 are sequentially stacked on a circuit board 1001. A spacer 1002 may be placed, for example, between the AP 1100 and the memory 1200. Bumps 1003 to connect the multi-chip package 1000 to a main circuit board may be placed, for example, on a bottom surface of the circuit board 1001.

The AP 1100 may be, for example, a processor to perform an application, and may include at least one CPU 1120. The CPU 1120 may control an overall operation of the AP 1100. To manage heat of the memory 1200, the CPU 1120 may, for example, control the AP 1100 based on a memory temperature Tm. For example, the CPU 1120 may decrease an operating frequency of the AP 1100 to lower the memory temperature Tm. As the AP 1100 and the memory 1200 are stacked, heat generated from the AP 1100 may be transferred to the memory 1200. Thus, a temperature of the AP 1100 may be reduced by, for example, lowering an operating frequency of the AP 1100. In this case, the memory temperature Tm may, for example, decrease.

The memory 1200 may be used to store data necessary to execute applications. The memory 1200 may be, for example, a volatile memory (e.g., DRAM or SRAM), a nonvolatile memory (e.g., a NAND flash memory, a NOR flash memory, a PRAM, a FRAM, or a RRAM), or a fusion memory (e.g., OneNAND or OneDRAM).

The memory 1200 may include, for example, a temperature measuring unit 1220 to measure the memory temperature Tm. Herein, the temperature measuring unit 1220 may sense a junction temperature of the memory 1200.

In example embodiments, the temperature measuring unit 1220 may sense the memory temperature Tm in real time to transfer the sensed memory temperature Tm to the CPU 1120.

Alternatively in example embodiments, the temperature measuring unit 1220 may, for example, sense the memory temperature Tm in response to a temperature measurement command of the CPU 1120 to transfer the sensed memory temperature Tm to the CPU 1120.

The multi-chip package 1000 may, for example, control the AP 1100 as a non-target part based on the memory temperature Tm sensed in real time to manage heat of the memory 1200 as a target part.

A detailed method of controlling a temperature of the memory 1200 may be the same or substantially the same as that described with reference to FIGS. 6 and 7.

Figure 12:
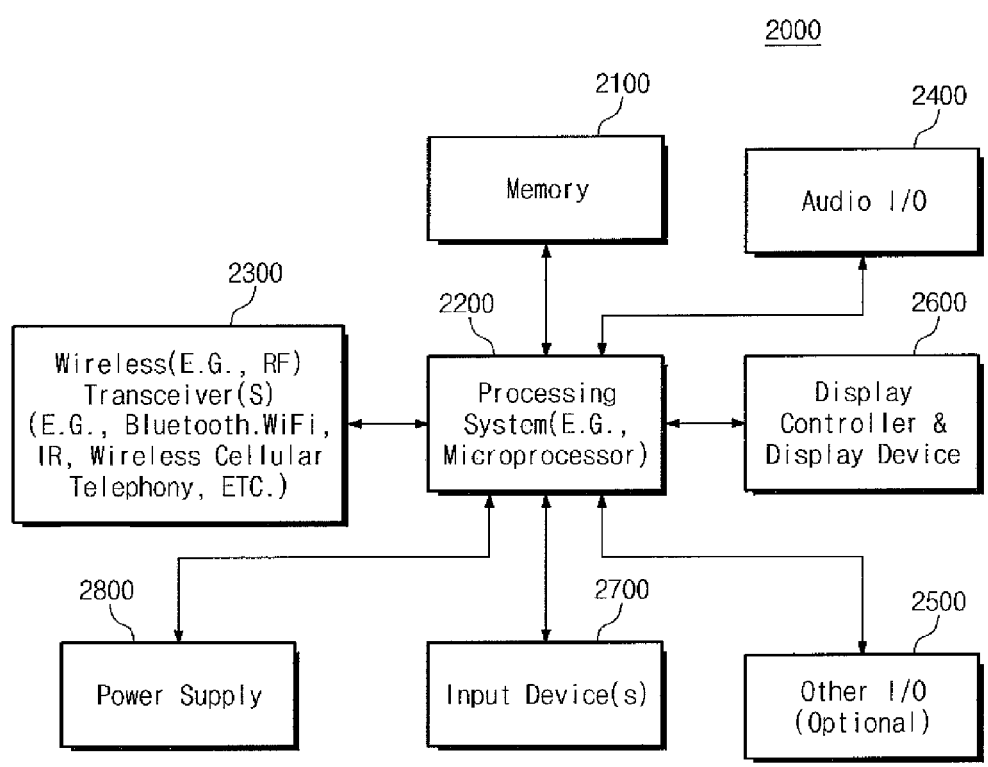
FIG. 12 is a block diagram illustrating a mobile device to which a temperature control method of an electronic device according to an embodiment of the inventive concept is applied.

FIG. 12 is a block diagram illustrating a mobile device to which a temperature control method of an electronic device according to an embodiment of the inventive concept is applied. Referring to FIG. 12, a mobile device 2000 may include, for example, a memory 2100, a processing system 2200, a wireless transceiver 2300, an audio input/output device 2400, other input/output devices 2500, a display controller and display device 2600, an input device 2700, and a power supply 2800.

A temperature control method of the mobile device 2000 may be the same or substantially the same as that described with reference to FIGS. 6 and 7.

Example embodiments of the inventive concept may be applicable to, for example, a tablet PC but exemplary embodiments are not limited thereto.

Figure 13:
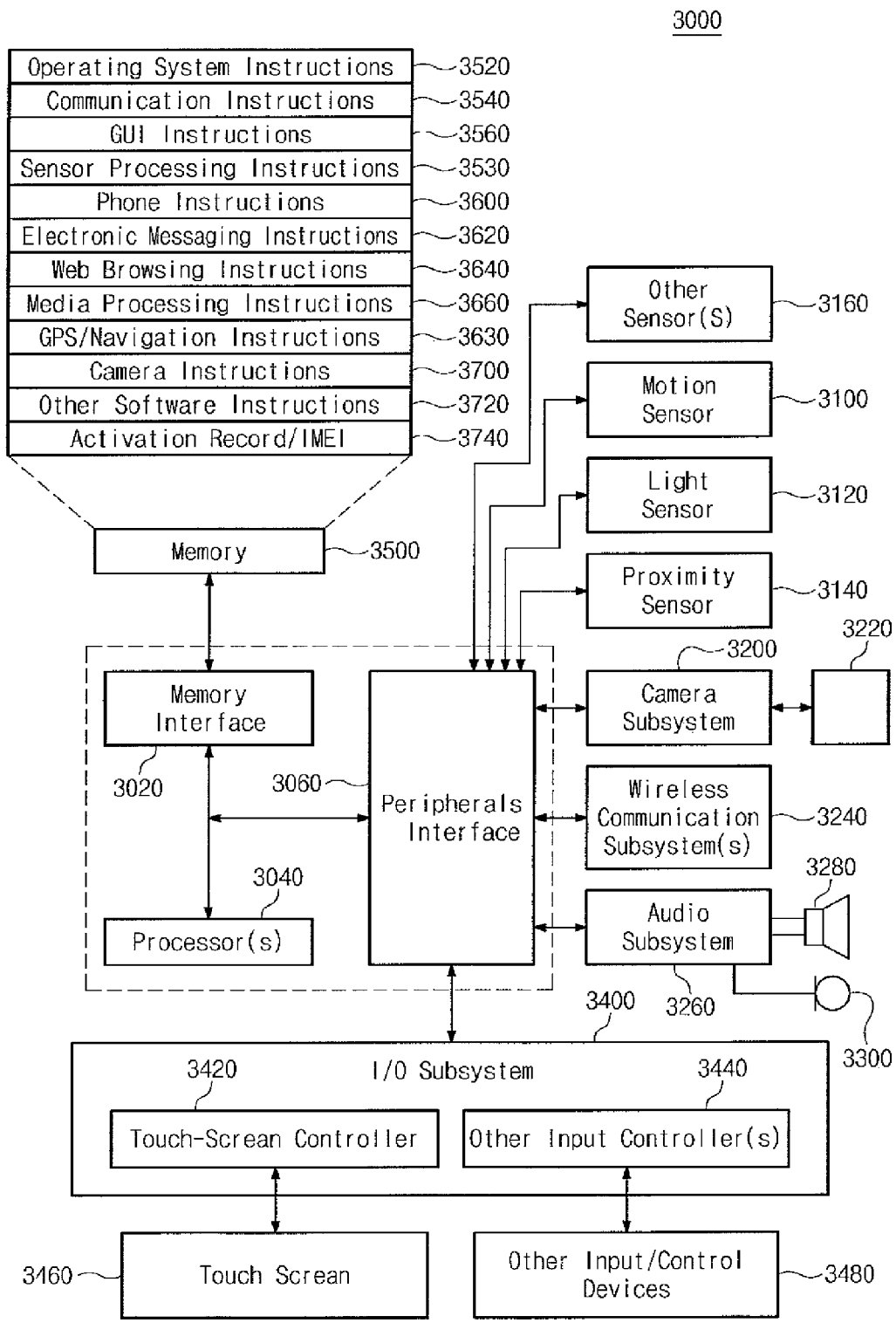
FIG. 13 is a block diagram schematically illustrating a tablet PC according to an embodiment of the inventive concept.

FIG. 13 is a block diagram schematically illustrating a tablet PC according to an embodiment of the inventive concept. Referring to FIG. 13, a tablet PC 3000 may manage, for example, heat of a memory 3500.

A temperature control method of the tablet PC 3000 may be the same or substantially the same as that described with reference to FIGS. 6 and 7.

A semiconductor chip or an AP of the inventive concept may be packed by a variety of packages such as, for example, PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and so on.

In addition, it is further noted that in example embodiments of the inventive concept, for example, a first target temperature T1 may be a temperature of a measurement point when a temperature of a target part becomes a reference temperature $T_{RS}$ at a first period of time. However, the first target temperature T1 may not be limited thereto. For example, to secure a temperature margin of the target part, the first target temperature T1 may be set to a temperature of the measurement point when a temperature of the target part is lower by a predetermined level than the reference temperature $T_{RS}$.

Having described exemplary embodiments of the present invention, it is further noted that it is readily apparent to those of ordinary skill in the art that various modifications may be made without departing from the spirit and scope of the invention which is defined by the metes and bounds of the appended claims

What is claimed is:

1. A method for controlling a temperature of an electronic device which includes a semiconductor chip, comprising:
   measuring a temperature of a measurement point using the electronic device, wherein the measurement point is a point of the semiconductor chip;
   computing a surface temperature of the electronic device based on the measured temperature of the measurement point and calculated thermal resistance between the measurement point and a surface of the electronic device, wherein the surface of the electronic device is a part different from the semiconductor chip; and
   decreasing a clock frequency of the semiconductor chip using the electronic device when the computed surface temperature of the electronic device is higher than a first target temperature.

2. The method of claim 1, further comprising: increasing the clock frequency of the electronic device when the computed surface temperature of the electronic device is lower than a second target temperature.

3. The method of claim 1, wherein the first target temperature corresponds to a predetermined surface temperature of the electronic device.

4. The method of claim 3, wherein the first target temperature is expressed by $(T_S + R_T \times T_R)$, and
   wherein $T_S$ is indicative of the predetermined surface temperature, $R_T$ is indicative of thermal resistance between the semiconductor chip and the surface of the electronic device, and $T_R$ is indicative of heat emitted from the surface of the electronic device to the semiconductor chip.

5. The method of claim 1, wherein the semiconductor chip includes one of an application processor, a central processing unit, a logic chip, or a memory chip.

6. The method of claim 1, wherein the surface of the electronic device comprises one of a housing, a display panel, a touch screen, or a window member.

7. A method for controlling a temperature of an electronic device which includes a semiconductor chip, comprising:
   measuring a temperature of a measurement point using the electronic device, wherein the measurement point is a point of the semiconductor chip;
   comparing the temperature of the measurement point with a target temperature corresponding to a temperature of a target part of the electronic device varying according to a period of time when the semiconductor chip operates using the electronic device, wherein the target part of the electronic device is a part different from the semiconductor chip;
   decreasing a clock frequency of the semiconductor chip using the electronic device when the temperature of the measurement point is higher than the target temperature; and
   increasing the clock frequency using the electronic device when the temperature of the measurement point is lower than a third target temperature due to a decrease in the clock frequency,
   wherein the period of time includes a first period of time and a second period of time which are continuous, wherein a first target temperature at the first period of time is higher than a second target temperature at the second period of time, and wherein the first period of time includes an overshoot period of time at which the temperature of the measurement point is higher than the second target temperature.

8. The method of claim 7, wherein a difference between the first target temperature and the second target temperature is over at least about 0.5 times a difference between the second target temperature and the third target temperature.

9. The method of claim 7, wherein the first period of time includes a first point of time when the temperature of the measurement point is lower than the third target temperature, a second point of time when the temperature of the measurement point reaches the first target temperature, and a third point of time when the temperature of the measurement point is lower than the first target temperature and higher than the second target temperature.

10. The method of claim 9, wherein a difference between the temperature of the measurement point and the third target temperature at the first point of time is over at least about two times a difference between the second target temperature and the third target temperature.

11. The method of claim 9, wherein the temperature of the measurement point at the third point of time is the second target temperature.

12. The method of claim 7, wherein the second period of time includes a throttling period in which the temperature of the measurement point increases or decreases according to iteration of a decrease and an increase of the clock frequency.

13. An electronic device comprising:
a package substrate;
a semiconductor chip mounted on the package substrate;
a temperature measuring device configured to measure a temperature of the semiconductor chip;
a dynamic temperature module (DTM) configured to manage a temperature of a target part of the electronic device using a temperature management table including information indicative of a thermal relationship between the measured temperature of the semiconductor chip and the temperature of the target part of the electronic device, wherein the target part of the electronic device is a part different from the semiconductor chip; and
a temperature control circuit configured to decrease a clock frequency of the semiconductor chip when the temperature of the semiconductor chip is higher than a target temperature.

14. The electronic device of claim 13, wherein the temperature measuring device is embedded in the package substrate and the temperature control circuit is built in the semiconductor chip.

15. An electronic device comprising:
a printed circuit board;
a semiconductor package mounted on the printed circuit board and electrically connected thereto, wherein the semiconductor package comprises:
a first package substrate disposed on the printed circuit board,
a semiconductor chip in a form of an application processor disposed on a top surface of the first package substrate, wherein the application processor includes at least one computer processing unit (CPU), a temperature measuring unit embedded in the application processor or the first package substrate configured to sense a temperature of a measurement point on the application processor, and a dynamic temperature module (DTM) configured to manage a temperature of a target part of the electronic device using a temperature management table including information indicative of a relationship between the sensed temperature of the measurement point of the application processor and a sensed temperature of the target part of the electronic device,
a second package substrate disposed on top of the first package substrate and electrically connected thereto, and
a plurality of memory chips attached to an upper surface of the second package substrate,
a temperature control circuit included in the application processor and configured to decrease a clock frequency of the application processor when a temperature of the application process is higher than a target temperature, wherein the target temperature varies according to a period of time at which the application processor operates;
an upper case disposed on the semiconductor package, wherein the upper case includes a display panel configured to display an image, a touch screen configured to compute coordinate information of a point touched by an input device of the display panel, and a window member disposed on the touch screen and wherein the window member includes a display region at which images generated by the display panel are displayed and a non-display region adjacent to at least a part of the display region; and
a housing configured to receive the printed circuit board, the semiconductor package, the display panel and the touch screen therein.

16. The electronic device of claim 15, wherein the display panel includes a first temperature measuring unit configured to sense a temperature of the display panel.

17. The electronic device of claim 16, further comprising an image sensor disposed within the window member, wherein the image sensor includes a second temperature measuring unit configured to sense a temperature of the image sensor.

18. The electronic device of claim 15, wherein the target part of the electronic device of which the temperature is measured includes at least one of the display panel, the touch screen, the housing and the window member.

19. The electronic device of claim 15, wherein the plurality of memory chips is interconnected to each other and attached to the upper surface of the second package substrate by an adhesive film, wherein the application processor is electrically connected to the first package substrate through bumps, and molded by a molding film and wherein the first substrate package and the second substrate package are electrically connected to each other by solder balls.

* * * * *